United States Patent [19]
Yui

[11] Patent Number: 5,787,013
[45] Date of Patent: Jul. 28, 1998

[54] AUTOMATIC ROUTING METHOD FOR INTER-FUNCTIONAL CELLS

[75] Inventor: Nobuyasu Yui, Tokyo, Japan

[73] Assignee: NEC Corporation, Tokyo, Japan

[21] Appl. No.: 593,526

[22] Filed: Jan. 30, 1996

[30] Foreign Application Priority Data

Jan. 30, 1995 [JP] Japan ................... 7-033176

[51] Int. Cl.⁶ .................................................. G06F 17/50
[52] U.S. Cl. ........................ 364/490; 364/489; 364/488
[58] Field of Search .................... 364/488, 489, 364/490, 441

[56] References Cited

U.S. PATENT DOCUMENTS

| | | | |
|---|---|---|---|
| 4,855,929 | 8/1989 | Nakajima | 364/490 |
| 5,224,057 | 6/1993 | Igarashi et al. | 364/490 |
| 5,475,611 | 12/1995 | Nagase et al. | 364/490 |

FOREIGN PATENT DOCUMENTS

| | | |
|---|---|---|
| 4-326551 | 11/1992 | Japan. |
| 4326551 | 11/1992 | Japan. |

*Primary Examiner*—Vincent N. Trans
*Attorney, Agent, or Firm*—Foley & Lardner

[57] ABSTRACT

In a semiconductor integrated circuit including a plurality of functional cells, it is determined whether or not each of the functional cells includes terminals to be electrically connected to each other. If a functional cell includes one of such terminals, a preset routing prohibiting area is set in the functional cell. If a functional cell does not include any of such terminals, a routing prohibiting area is set in the entirety of the functional cell. Then, routing between the terminals is carried out in accordance with the routing prohibiting areas.

5 Claims, 25 Drawing Sheets

*Fig. 4A*
PRIOR ART
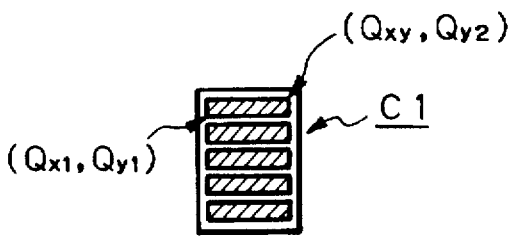
*Fig. 4B*
PRIOR ART
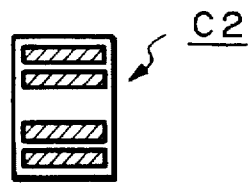
*Fig. 4C*
PRIOR ART
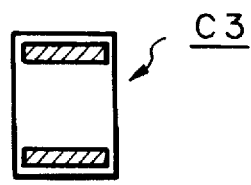
 ROUTING PROHIBITING AREA

T2ˣ

T1ˣ

▨ ROUTING PROHIBITING AREA

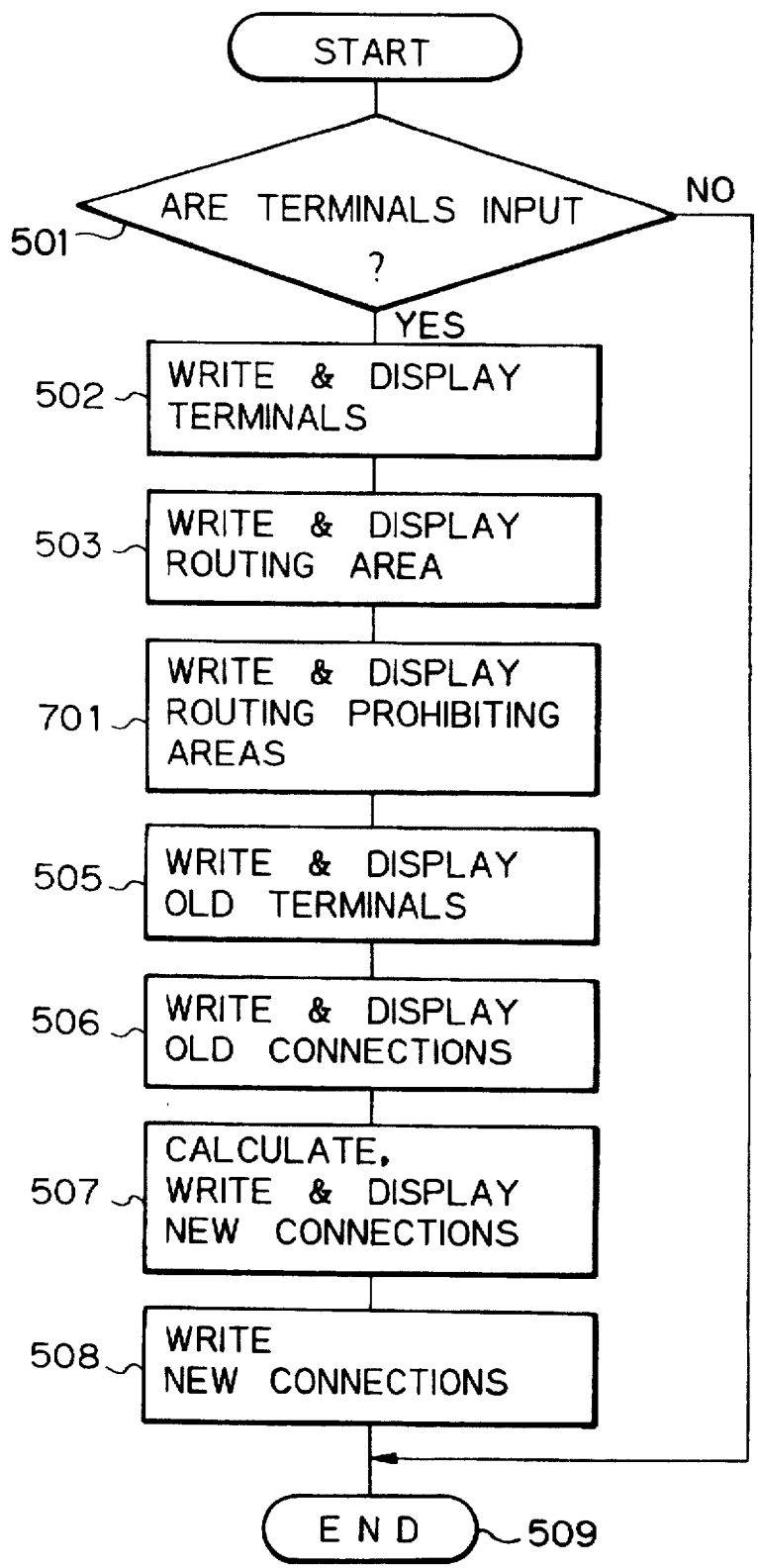

T2ˣ

T1ˣ

▨ ROUTING PROHIBITING AREA

T2$^x$

T1$^x$

▨ ROUTING PROHIBITING AREA

T2$^x$

T1$^x$

▨ ROUTING PROHIBITING AREA

T2$^x$

T1$^x$

▨ ROUTING PROHIBITING AREA

AUTOMATIC ROUTING METHOD FOR INTER-FUNCTIONAL CELLS

BACKGROUND OF THE INVENTION

1. Field of the Invention

The present invention relates to a method for laying out a semiconductor integrated circuit, and more particularly, to an automatic routing method for inter-functional cells.

2. Description of the Related Art

A prior art automatic routing method for inter-functional cells is carried out as follows. First, a routing area is set for terminals to be electrically connected to each other. Then, a routing prohibiting area is set in each functional cell within the routing area in accordance with its logic information. Also, other routing prohibiting areas are set in the routing area in accordance with other terminal information outside and inside of the routing area for which routing is already carried out. Finally, routing is performed upon the terminals in accordance with the routing prohibiting areas. This will be explained later in detail.

In the above-described prior art automatic routing method, however, when the semiconductor integrated circuit is highly-integrated so as to increase the number of functional cells, the amount of information of routing prohibiting areas is remarkably increased, thus increasing the capacity of a memory for storing such information. Also, the more the information of routing prohibiting areas, the lower the routing speed.

Note that, it is already known that routing prohibiting areas as cell library are compressed to reduce the amount of memory required (see: JP-A-4-326551); however, this is limited to the routing prohibiting areas defined in the cell library.

SUMMARY OF THE INVENTION

It is an object of the present invention to provide an automatic routing method for inter-functional cells capable of being carried out at a higher speed with a smaller memory.

According to the present invention, in a semiconductor integrated circuit including a plurality of functional cells, it is determined whether or not each of the functional cells includes terminals to be electrically connected to each other. If a functional cell includes one of such terminals, a preset routing prohibiting area is set in the functional cell. If a functional cell does not include any of such terminals, a routing prohibiting area is set in the entirety of the functional cell. Then, routing between the terminals is carried out in accordance with the routing prohibiting areas.

Thus, the amount of information of routing prohibiting areas is reduced, thereby increasing the automatic routing speed.

BRIEF DESCRIPTION OF THE DRAWINGS

The present invention will be more clearly understood from the description as set forth below, in comparison with the prior art, with reference to the accompanying drawings, wherein:

FIGS. 4A, 4B and 4C are diagrams showing examples of routing prohibiting information for functional cells of FIG. 2;

FIG. 7 is a flowchart illustrating an embodiment of the automatic routing method according to the present invention;

DESCRIPTION OF THE PREFERRED EMBODIMENT

Before the description of the preferred embodiment, prior art automatic routing apparatus and method will be explained with reference to FIGS. 1, 2, 3, 4A, 4B, 4C, 5, 6A, 6B, 6C, 6D and 6E.

Figure 1:
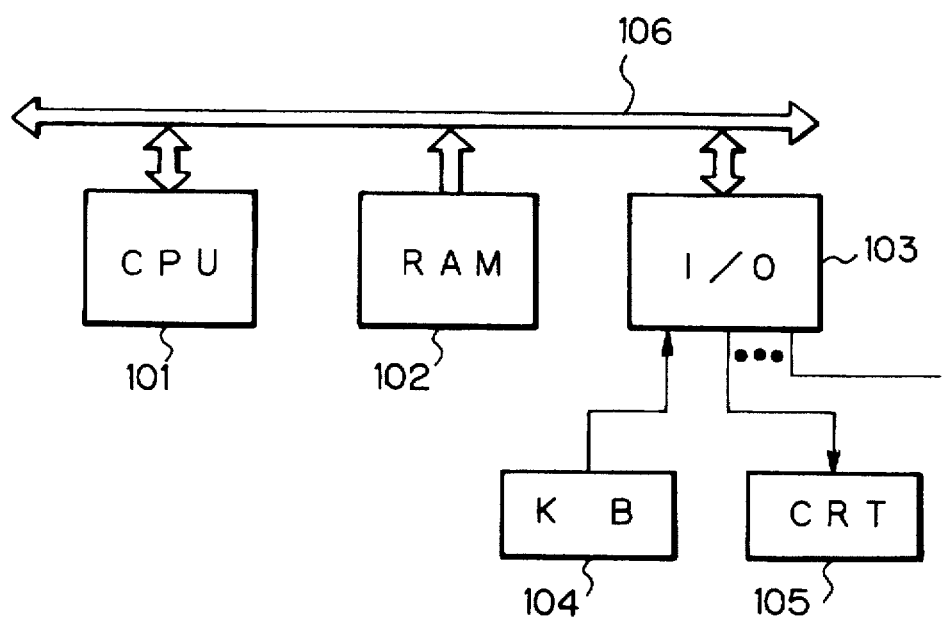
FIG. 1 is a block circuit diagram illustrating a prior art automatic routing apparatus.

In FIG. 1, which illustrates a prior art automatic routing apparatus, reference numeral 101 designates a central processing unit (CPU), 102 designates a random access memory (RAM) for storing programs, constants and temporary data, and 103 designates an input/output (I/O) interface connected to a keyboard 104, a display unit 105, and the like. The CPU 101, the RAM 102 and the I/O interface 103 are connected to each other by a bus 106.

Figure 2:
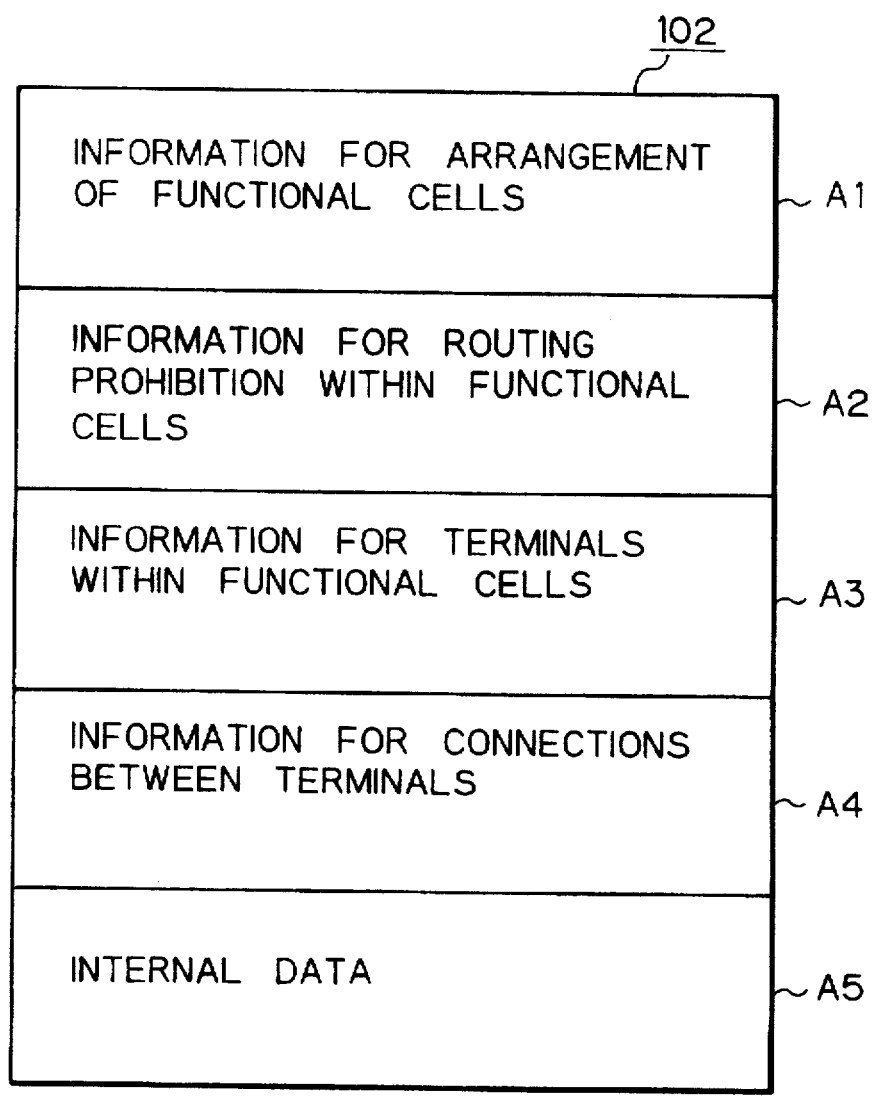
FIG. 2 is a diagram showing the content of the RAM of FIG. 1.

As illustrated in FIG. 2, the RAM 102 is comprised of an area A1 for storing information for arrangement of functional cells, an area A2 for storing information for routing prohibition within functional cells, an area A3 for storing information for terminals within the functional cells, an area A4 for storing information for connections between terminals, and an area A5 for storing internal data.

Figure 3:
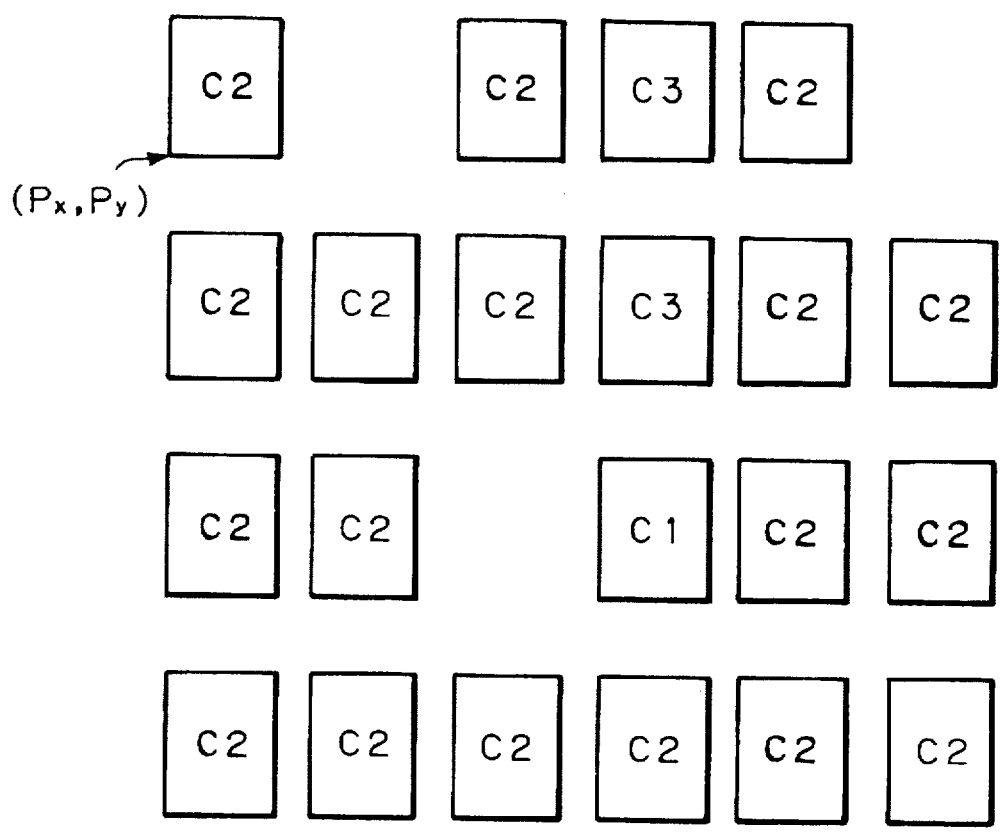
FIG. 3 is a diagram showing an example of information for arrangement of functional cells of FIG. 2.

For example, the information for arrangement of functional cells stored in the area A1 shows kinds of functional cells C1, C2 and C3 associated with their location information ($P_x$, $P_y$) as shown in FIG. 3.

Also, the information for routing prohibition with functional cells stored in the area A2 shows routing prohibiting areas defined by two location information ($Q_{x1}$, $Q_{y1}$) and ($Q_{x2}$, $Q_{y2}$) diagonally located in the functional cells C1, C2 and C3 as shown in FIGS. 4A, 4B and 4C.

Further, the information stored in the area A3 shows terminals within functional cells. The terminals of functional cells other than the functional cells including terminals to be electrically connected to each other/also serve as routing prohibiting information for the latter functional cells. Further, the information stored in the area A4 shows connections between the terminals within the functional cells. The connections between the terminals of functional cells other than the functional cells including terminals to be electrically connected to each other also serve as routing prohibiting information for the latter functional cells.

Note that the internal data storing area A5 is used in execution of an automatic routing routine.

Figure 5:
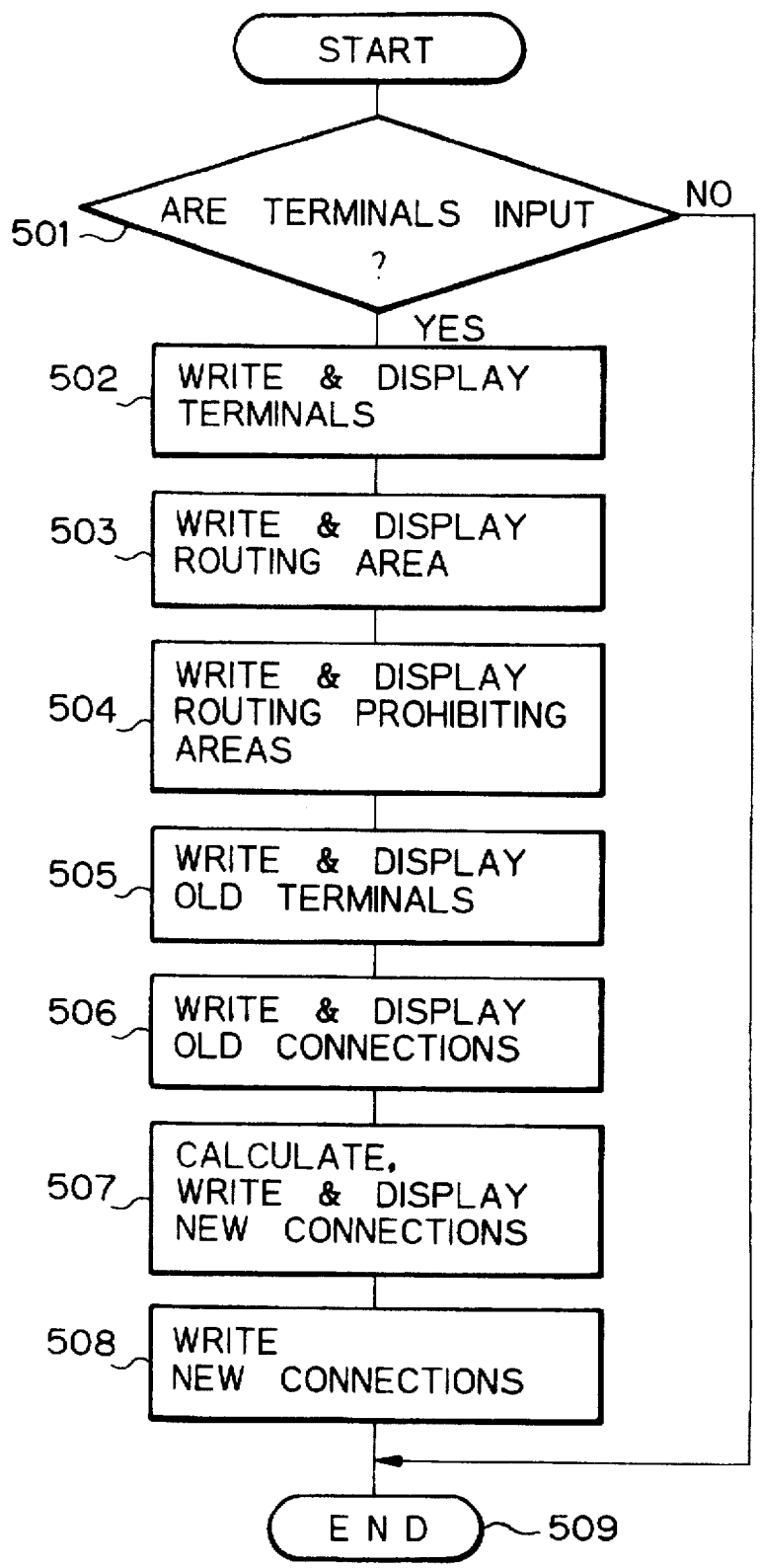
FIG. 5 is a flowchart illustrating a prior art automatic routing method.

FIG. 5 is a flowchart showing the operation of the CPU 101 of FIG. 1 as a prior art automatic routine method. The flowchart of FIG. 5 is explained next with reference to FIGS. 6A through 6E which show the content of the display unit 105.

First, at step 501, it is determined whether terminals to be electrically connected to each other are input from the keyboard 104. If such terminals are input, the control proceeds to step 502. Otherwise, the control proceeds directly to step 509.

Figures 6A, 6B:
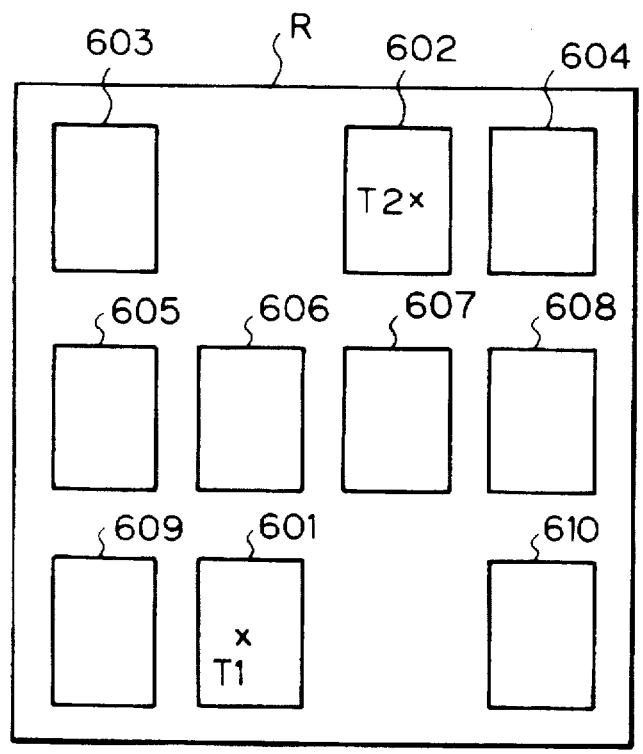
FIGS. 6A through 6E are diagrams for explaining the flowchart of FIG. 5.

Next, at step 502, input terminals T1 and T2 are written into the area A5 of the RAM 102, and simultaneously, the input terminals T1 and T2 are displayed on the display unit 105 as shown in FIG. 6A.

Next, at step 503, functional cell arrangement information is read from the area A1 of the RAM 102, and a routing area R is set in accordance with this information. The routing area R is written into the area A5 of the RAM 102, and simultaneously, is displayed on the display unit 105 as shown in FIG. 6B. In this case, the routing area R includes not only functional cells 601 and 602 including the terminals T1 and T2, but functional cells 603 to 610 adjacent to the functional cells 601 and 602.

Figures 6C, 6D:
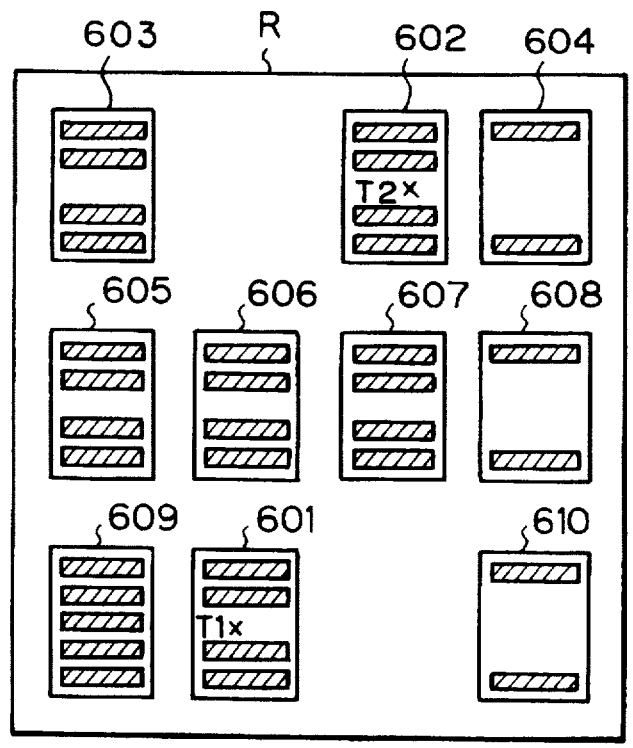

Next, at step 504, routing prohibiting information is read from the area A2 of the RAM 102, and routing prohibiting areas are set within the functional cells 601 to 610 in accordance with this information. The routing prohibiting areas are written into the area A5 of the RAM 102, and simultaneously, are displayed on the display unit 104 as shown in FIG. 6C.

Next, at step 505, terminal information for other terminals than T1 and T2 is read from the area A3 of the RAM 102, and routing prohibiting areas are set within the functional cells 601 to 610 in accordance with this information. The routing prohibiting areas are written into the area A5 of the RAM 102, and simultaneously, are displayed on the display unit 104.

Next, at step 506, connection information for other terminals than T1 and T2 is read from the area A4 of the RAM 102, and routing prohibiting areas are set within the functional cells 601 to 610 in accordance with this information. The routing prohibiting areas are written into the area A5 of the RAM 102, and simultaneously, are displayed on the display unit 104 as indicated by X in FIG. 6D.

Figure 6E:
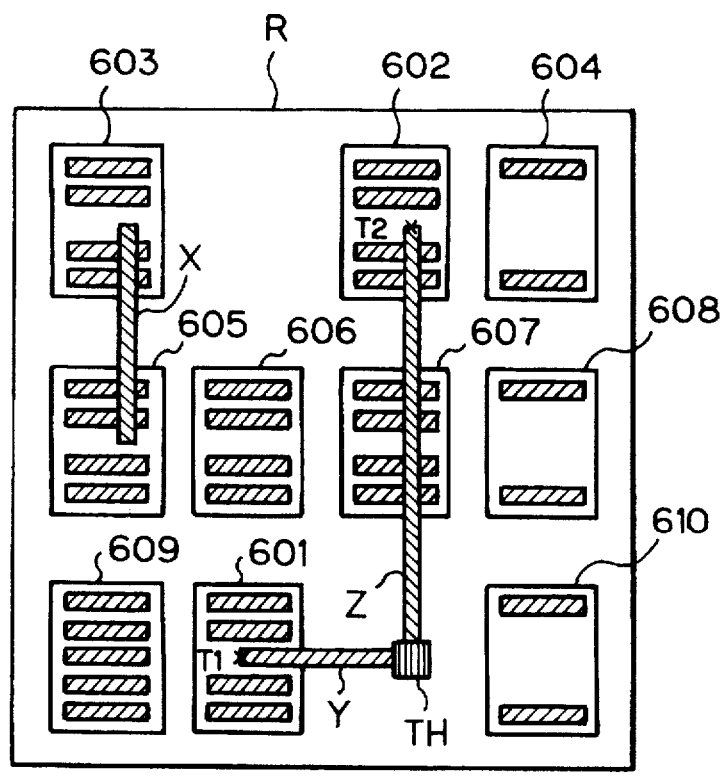

Next, at step 507, connections Y and Z are set between the terminals T1 and T2 in accordance with the routing prohibiting areas set at steps 504, 505 and 506. The connections Y and Z are written into the area A5 of the RAM 102, and simultaneously, are displayed on the display unit 105 as shown in FIG. 6E. In this case, the connection Y is made of a first conductive layer, while the connection Z and the connection X are made of a second conductive layer. Also, the connection Y is connected via a throughhole TH to the connection Z.

Next, at step 508, the connections Y and Z are also written into the area A4 of the RAM 102.

Then, this routine is completed by step 509.

According to FIGS. 5 and 6A through 6E, the number of routing prohibiting areas including the connection X is 36. Also, when the semiconductor integrated circuit is highly-integrated so as to increase the number of functional cells, the amount of information of routing prohibiting areas is remarkably increased, thus increasing the capacity of the RAM 102 for storing such information. Also, the more the information of routing prohibiting areas, the lower the routing speed.

In FIG. 7, which illustrates an embodiment of the present invention, step 701 is provided instead of step 504 of FIG. 5. Step 701 is illustrated in detail in FIG. 8. In this case, note that FIGS. 9A through 9E correspond to FIGS. 6A through 6E, respectively.

Figure 8:
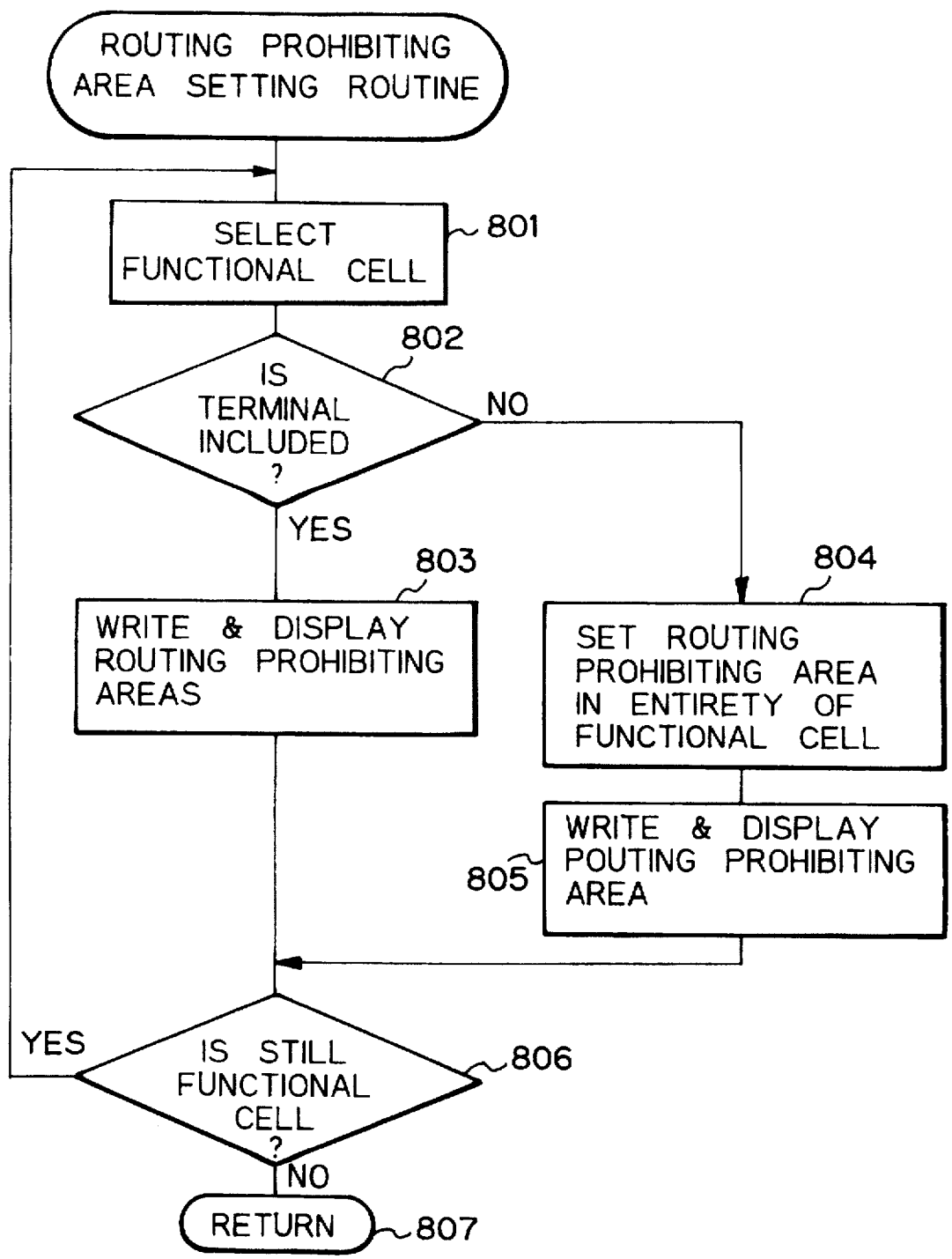
FIG. 8 is a first detailed flowchart of step 701 of FIG. 7.
Figures 9A, 9B:
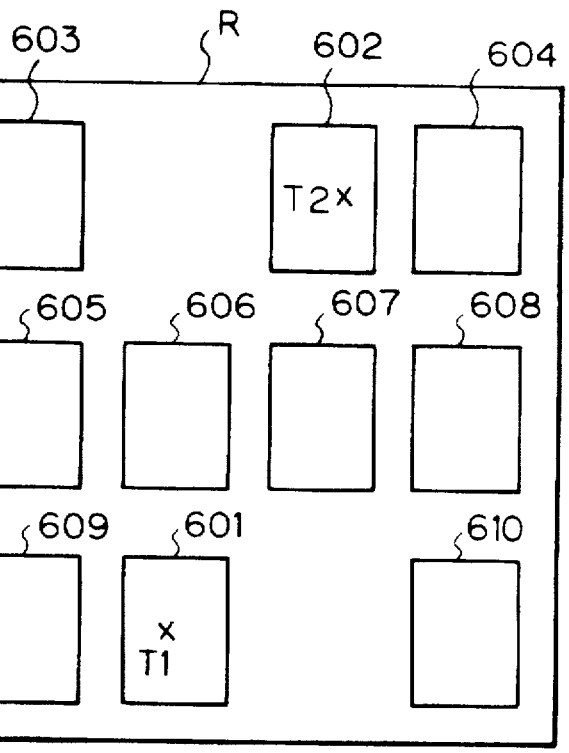
FIGS. 9A through 9E are diagrams for explaining the flowchart of FIG. 8.

That is, when terminals T1 and T2 as shown in FIG. 9A are input from the keyboard 104, the control proceeds from step 501 via step 502 to step 503. As a result, a routing area R as shown in FIG. 9B is set. Then, the control proceeds to step 801 of FIG. 8.

At step 801, the CPU 101 selects one functional cell within the routing area R. Then, at step 802, it is determined whether or not the selected functional cell includes the terminal T1 or T2. As a result, if the selected functional cell such as 601 or 602 includes the terminal T1 or T2, the control proceeds to step 803. On the other hand, if the selected functional cell such as 603, 604, . . . , or 610 does not include the terminal T1 or T2, the control proceeds to steps 804 and 805.

Figure 9C:
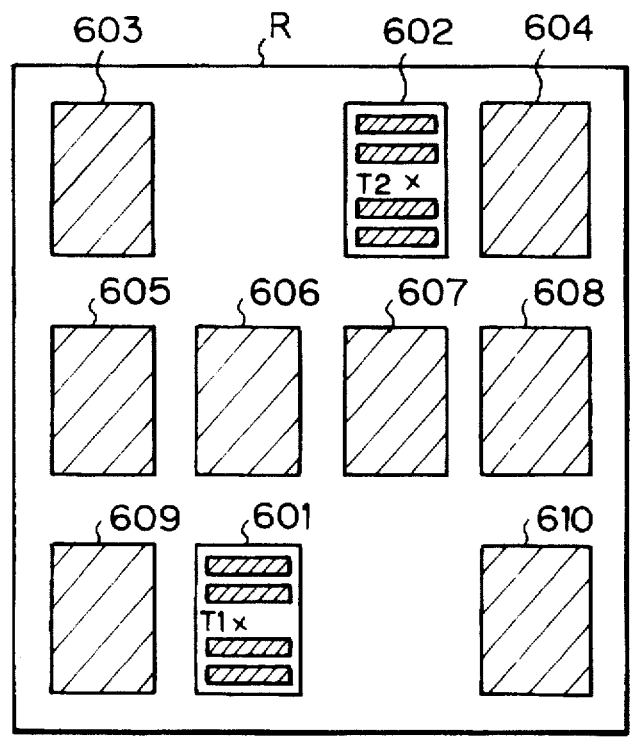

At step 803, routing prohibiting information is read from the area A2 of the RAM 102, and routing prohibiting areas are set within the selected functional cell 601 or 602 in accordance with this information. The routing prohibiting areas are written into the area A5 of the RAM 102, and simultaneously, are displayed on the display unit 104 as shown in FIG. 9C.

On the other hand, at step 804, a routing prohibiting area is set on the entirety of the selected functional cell such as 603, 604, . . . , or 610. Also, at step 805, the routing prohibiting area is written into the area A5 of the RAM 102, and simultaneously, is displayed on the display unit 104 as shown in FIG. 9C.

Step 806 repeats the operations at steps 801 through 805 for all the functional cells 601 through 610 within the routing area R.

Then, at step 807, the control returns to step 505 of FIG. 7.

Figure 9D:
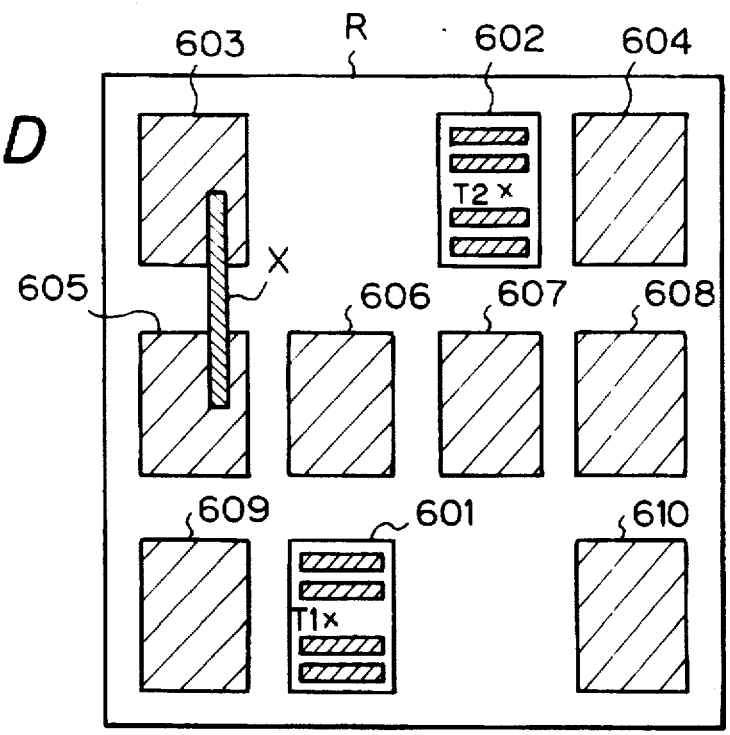

Then, at steps 505 and 506, in the same way as in the prior art, connections for other terminals than T1 and T2 are written as routing prohibiting areas into the area A5 of the RAM 102, and simultaneously, are displayed on the display unit 104 as indicated by X in FIG. 9D.

Figure 9E:
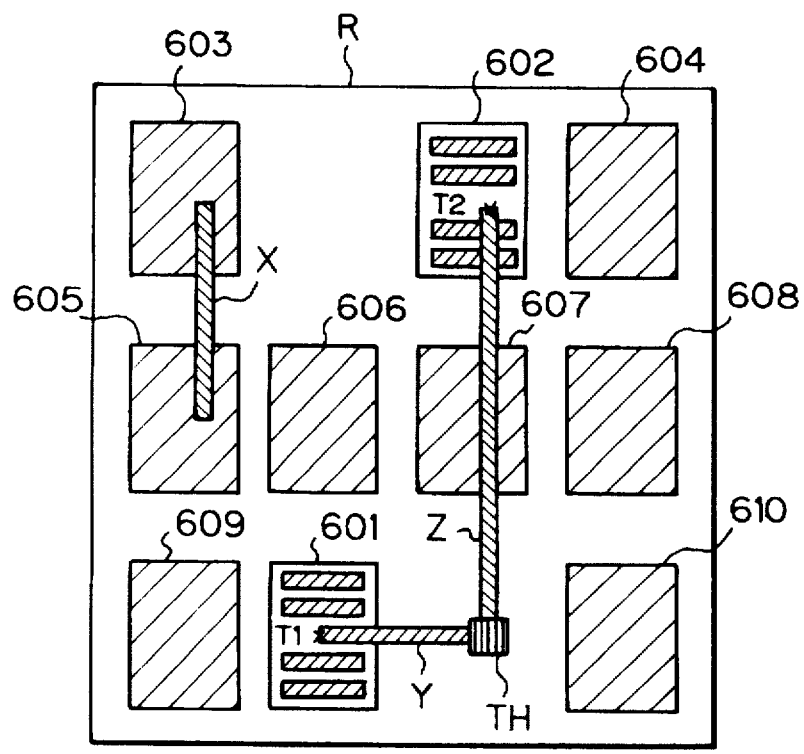

Also, at step 507, in the same way as in the prior art, connections Y and Z are set between the terminals T1 and T2 in accordance with the routing prohibiting areas set at steps 701, 505 and 506. The connections Y and Z are written into the area A5 of the RAM 102, and simultaneously, are displayed on the display unit 105 as shown in FIG. 9E.

Next, at step 508, the connections Y and Z are also written into the area A4 of the RAM 102.

Then, this routine is completed by step 509.

According to FIGS. 7, 8 and 9A through 9E, the number of routing prohibiting areas including the connection X is 17, and therefore, is remarkably reduced as compared with the prior art as shown in FIG. 5 and FIGS. 6A through 6E.

Figure 10:
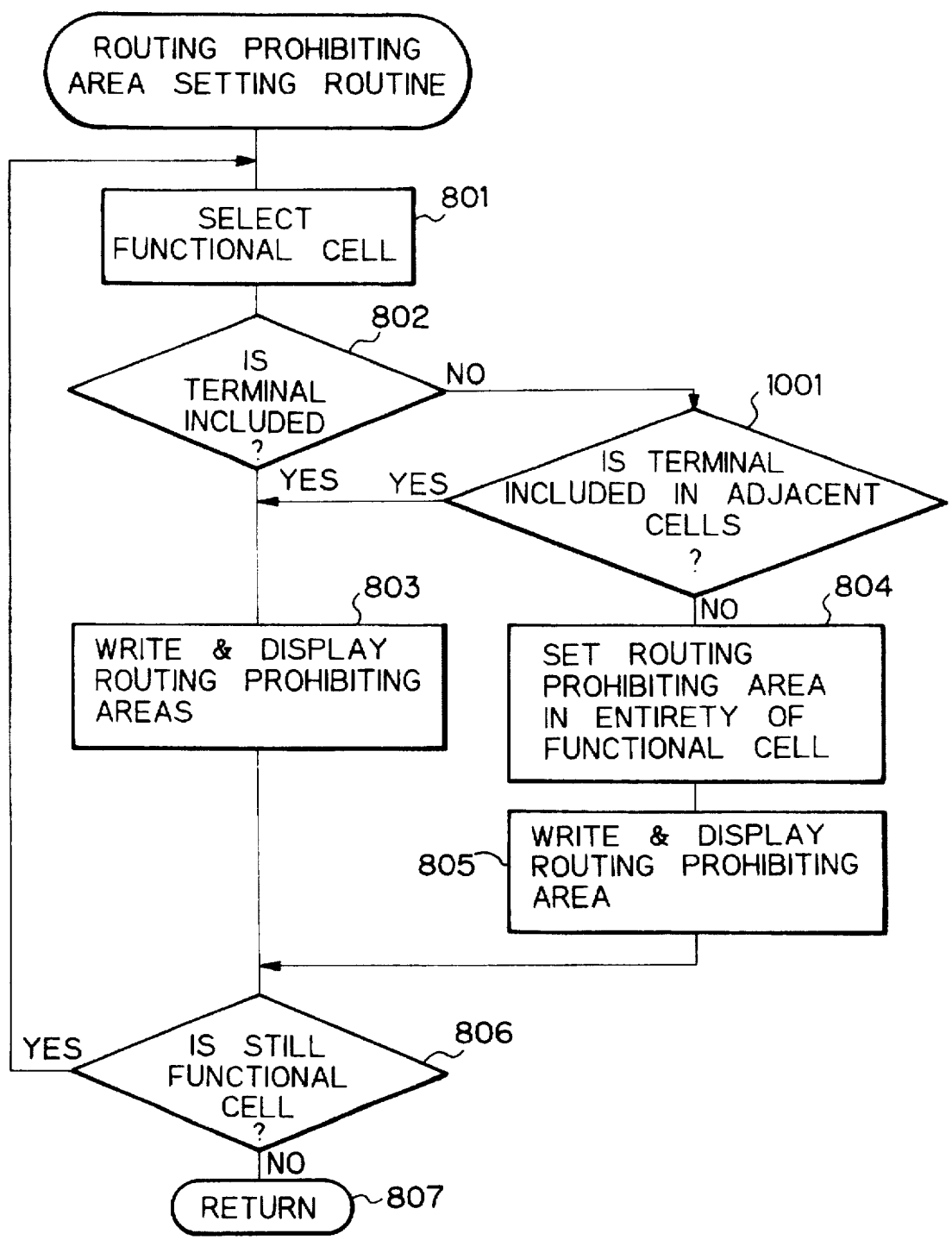
FIG. 10 is a second detailed flowchart of step 701 of FIG. 7.
Figures 11A, 11B:
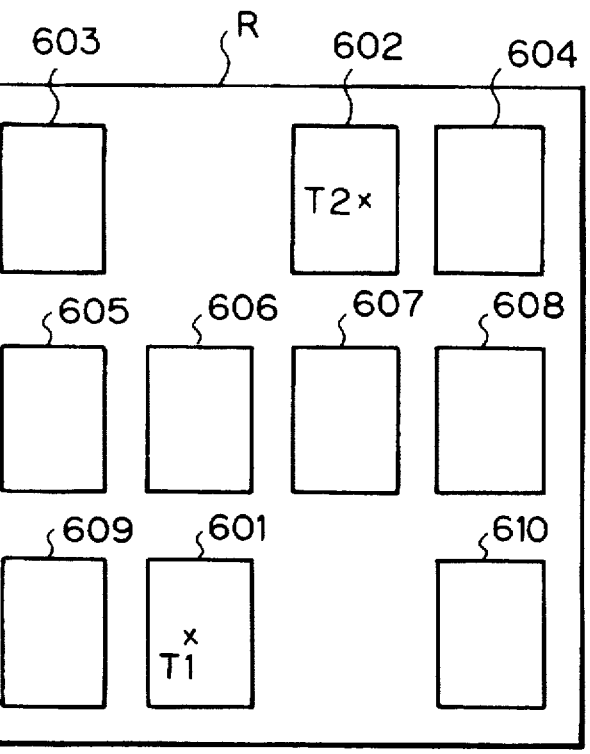
FIGS. 11A through 11E are diagrams for explaining the flowchart of FIG. 10.

In FIG. 10, which is a modification of the routine of FIG. 8, step 1001 is added to the routine of FIG. 8. In this case, note that FIGS. 11A throuth 11E correspond to FIGS. 9A through 9E, respectively. When it is determined at step 802 that the selected functional cell does not include the terminal T1 or T2, the control proceeds to step 1001 which determines whether functional cells adjacent to the selected functional cell include the terminal T1 or T2. If at least one of the adjacent cells includes the terminal T1 or T2, the control proceeds to step 803. Otherwise, the control proceeds to steps 804 and 805. Note that adjacent functional cells include functional cells on the right and left sides of a selected functional cell, functional cells on the up and down sides of the selected functional cell, and functional cells on the diagonal sides of the selected functional cell.

Figure 11C:
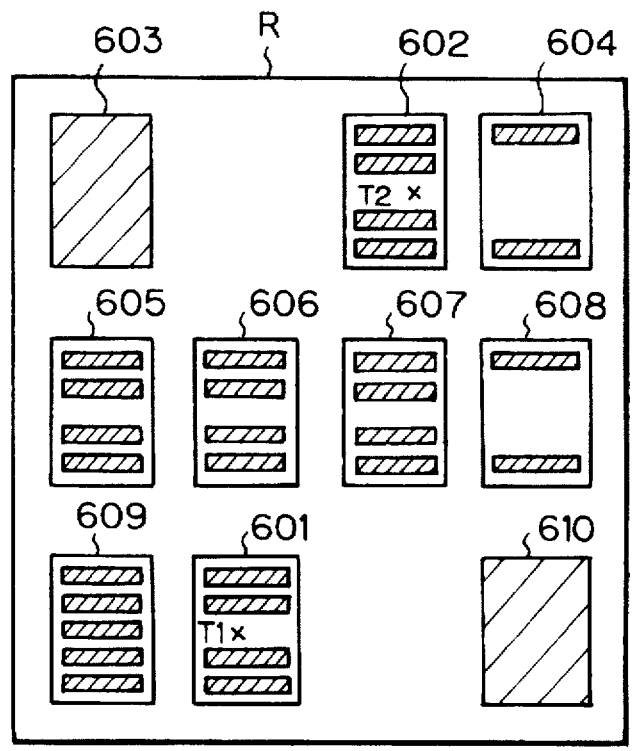

Therefore, at step 803, routing prohibiting information is read from the area A2 of the RAM 102, and routing prohibiting areas are set within the selected functional cell such as 601, 602, 604, 605, 606, 607, 608 or 609 in accordance with this information. The routing prohibiting areas are written into the area A5 of the RAM 102, and are displayed on the display unit 104 as shown in FIG. 11C.

On the other hand, at step 804, a routing prohibiting area is set on the entirety of the selected functional cell such as 603 or 610. Also, at step 805, the routing prohibiting area is written into the area A5 of the RAM 102, and simultaneously, is displayed on the display unit 104 as shown in FIG. 11C.

Figure 11D:
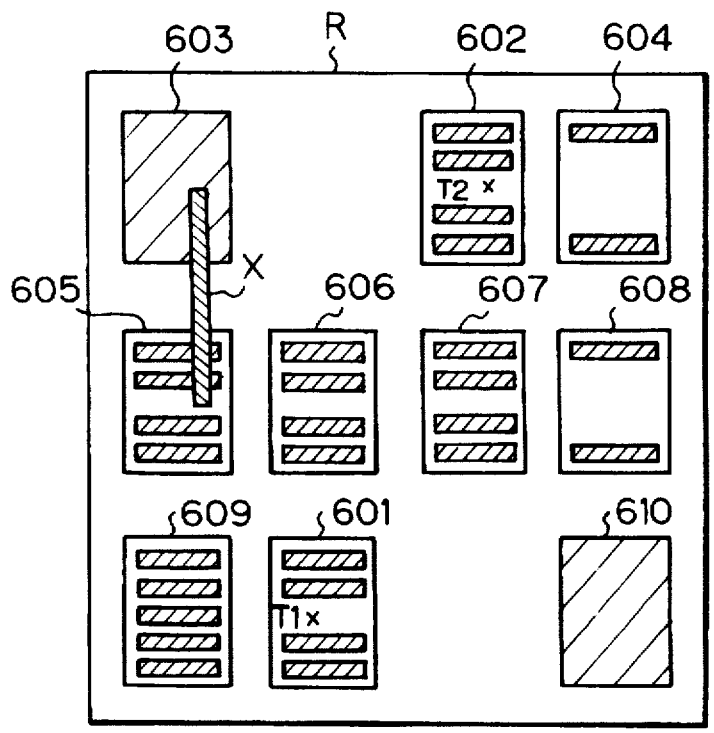
Figure 11E:
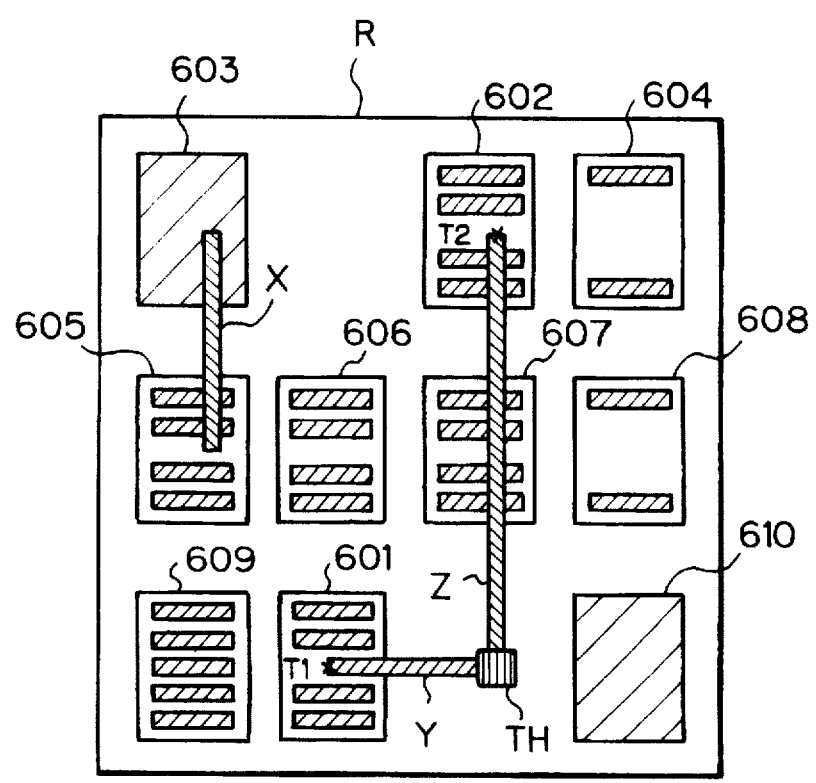

Then, as shown in FIGS. 11D and 11E, in the same way in the prior art, the connections X, Y and Z are written into the area A5 of the RAM 102, and simultaneously, are displayed on the display unit 105.

According to FIGS. 7, 10 and 11A through 11E, the number of routing prohibiting areas including the connection X is 32, and is larger than that as shown in FIGS. 7, 8 and 9A through 9E. In this case, more effective use is made of the routing area R.

Figure 12:
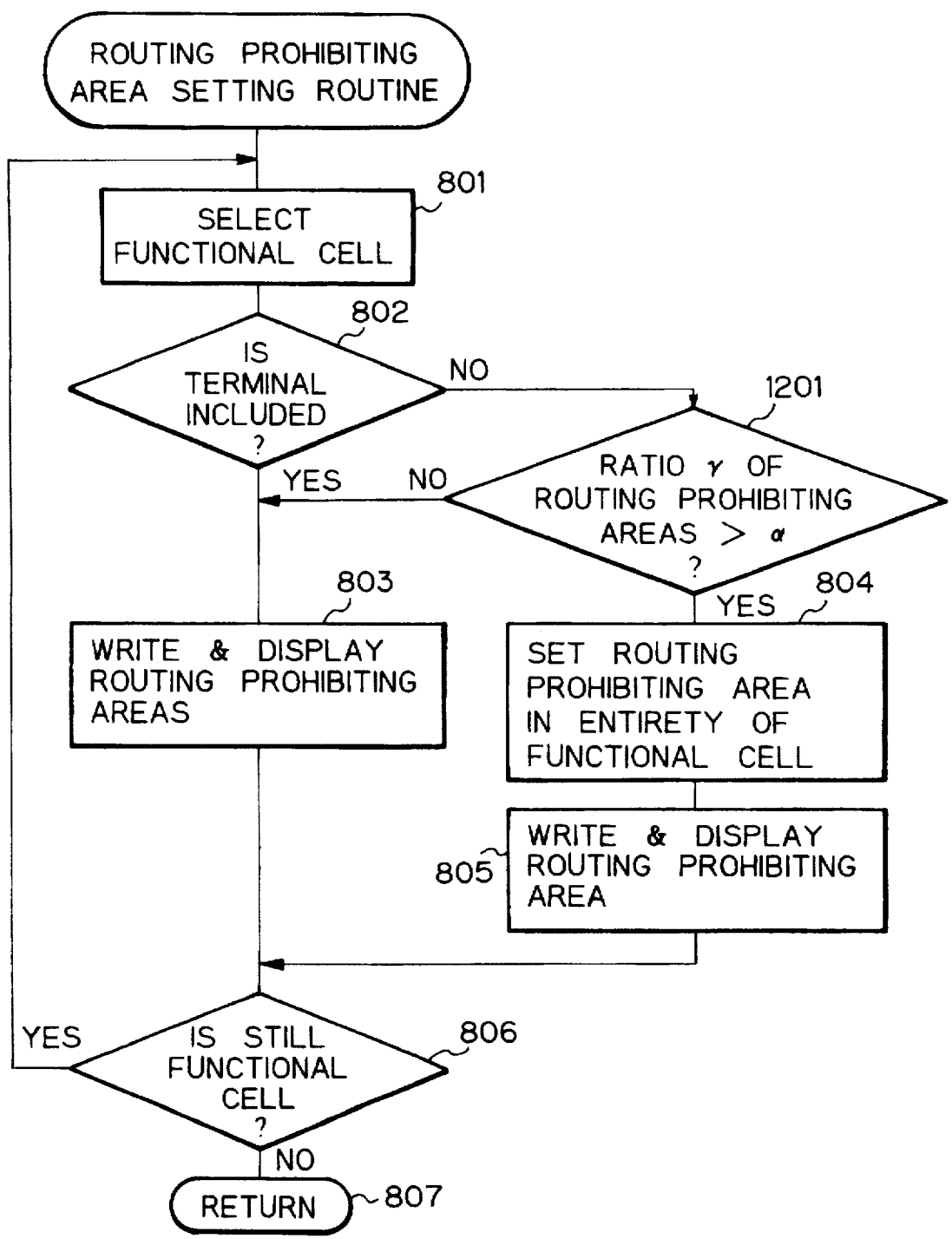
FIG. 12 is a third detailed flowchart of step 701 of FIG. 7.

In FIG. 12, which is another modification of the routine of FIG. 8, step 1201 is added to the routine of FIG. 8. In this case, note that FIGS. 13A through 13E correspond to FIGS. 9A through 9E, respectively. As a result, when it is determined at step 802 that the selected functional cell does not include the terminal T1 or T2, the control proceeds to step 1201 which determines whether a ratio $\gamma$ of routing prohibiting areas to the entire area of the selected functional cell is larger than $\alpha$ (predetermined definite value). For example, assume that $\gamma > \alpha$ for functional cells as shown in FIGS. 4A and 4B, and assume that $\gamma < \alpha$ for functional cells as shown in FIG. 4C. As a result, when it is determined at step 802 that the selected functional cell does not include the terminal T1 or T2, the control proceeds to step 1201 which determines whether $\gamma > \alpha$. If the selected functional cell is a functional cell 604, 608 or 610 as shown in FIG. 6C, $\gamma \leq \alpha$, so the control proceeds to step 803. Contrary to this, if the selected functional cell is a functional cell 603, 605, 606, 607 or 609 as shown in FIG. 6C, $\gamma > \alpha$, so the control proceeds to step 804.

Figures 13A, 13B:
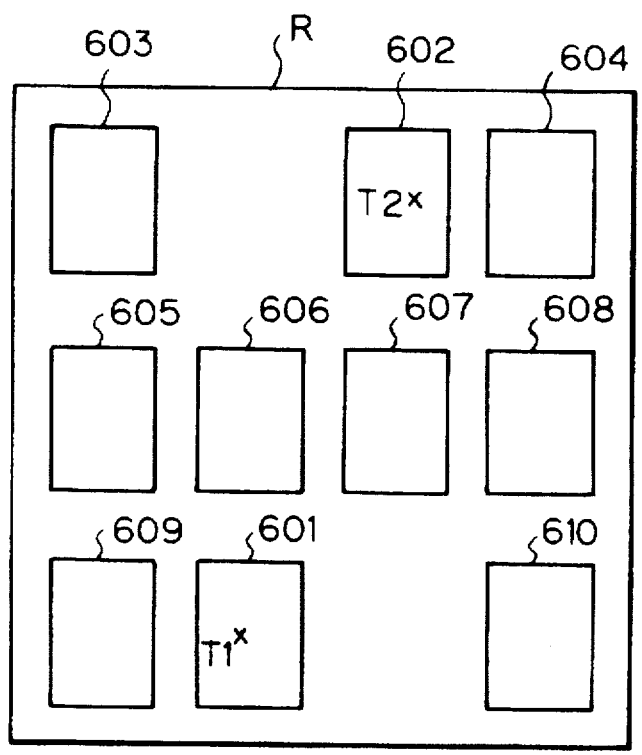
FIGS. 13A through 13E are diagrams for explaining the flowchart of FIG. 12.
Figure 13C:
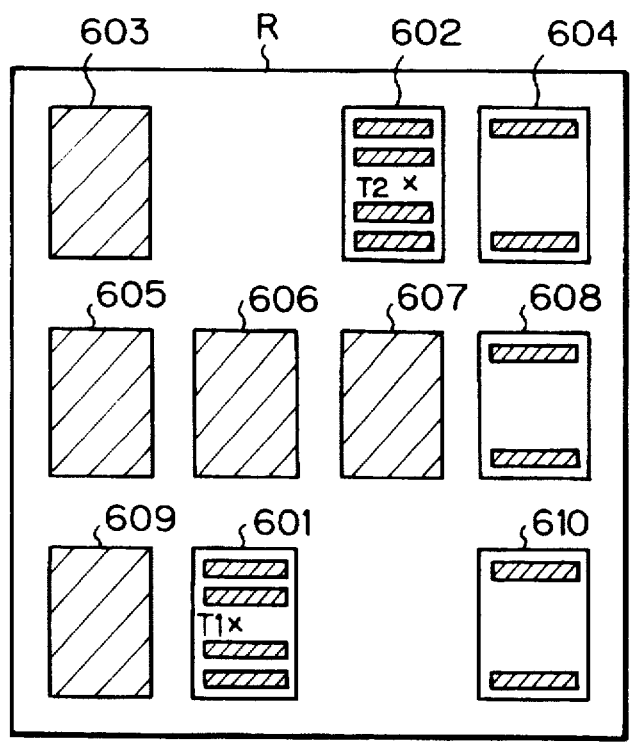

Therefore, at step 803, routing prohibiting information is read from the area A1 of the RAM 102, and routing prohibiting areas are set within the selected functional cell such as 601, 602, 604, 608 or 610 in accordance with this information. The routing prohibiting areas are written into the area A5 of the RAM 102, and simultaneously, are displayed on the display unit 104 as shown in FIG. 13C.

On the other hand, at step 804, a routing prohibiting area is set on the entirety of the selected functional cell such as 603, 605, 606, 607 or 609. Also, at step 805, the routing prohibiting area is displayed on the display unit 105 as shown in FIG. 13C.

Figure 13D:
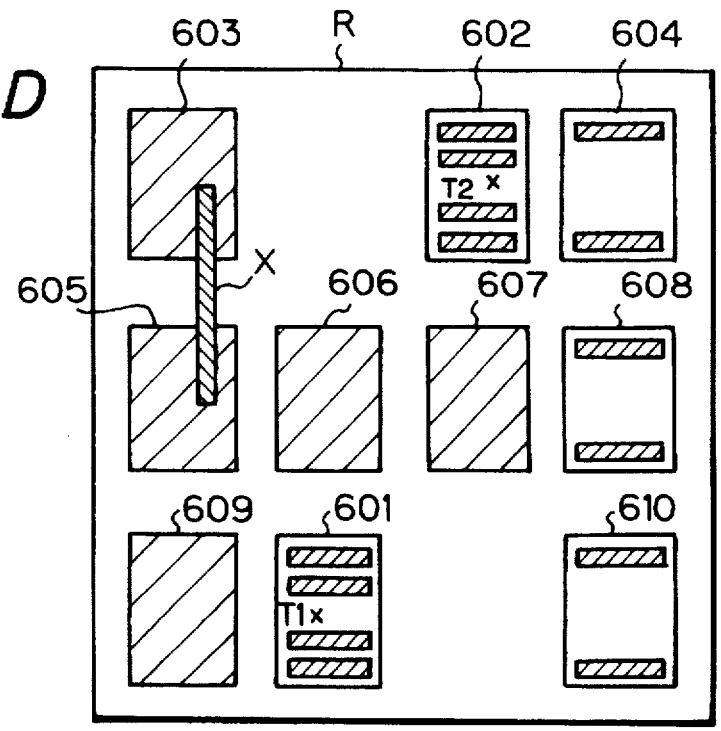
Figure 13E:
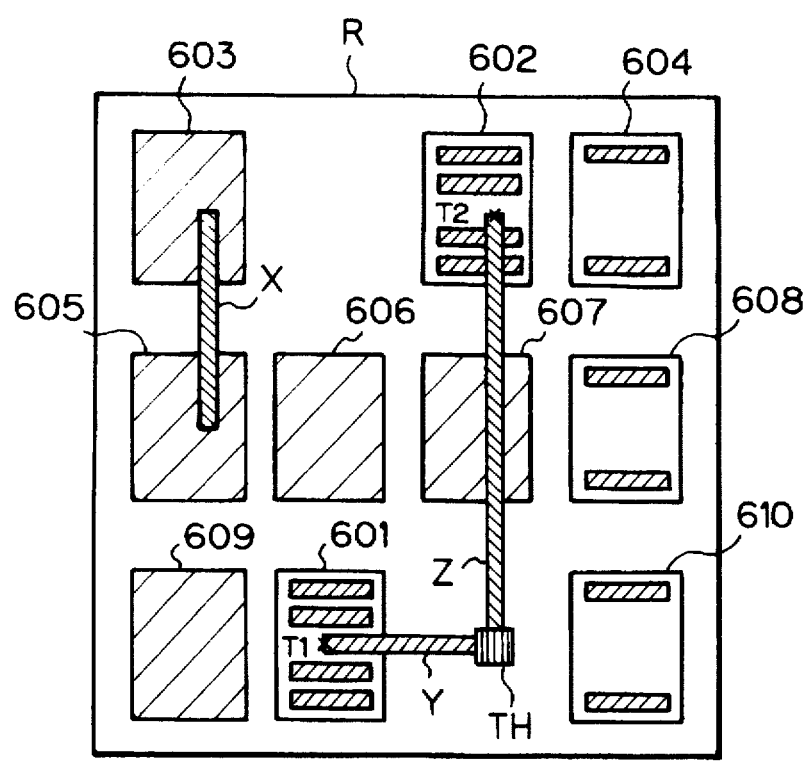

Then, as shown in FIGS. 13D and 13E, in the same way as in the prior art, the connections X, Y and Z are written into the area A5 of the RAM 102, and simultaneously, are displayed on the display unit 105.

According to FIGS. 7, 12 and 13A through 13E, the number of routing prohibiting areas including the connection X is 20, and therefore, is remarkably reduced as compared with the prior art as shown in FIGS. 5 and 6A through 6E. Although the number of routing prohibiting areas is larger than that as shown in FIGS. 7, 8 and 9A through 9E, more effective use is made of the routing area R.

Figure 14:
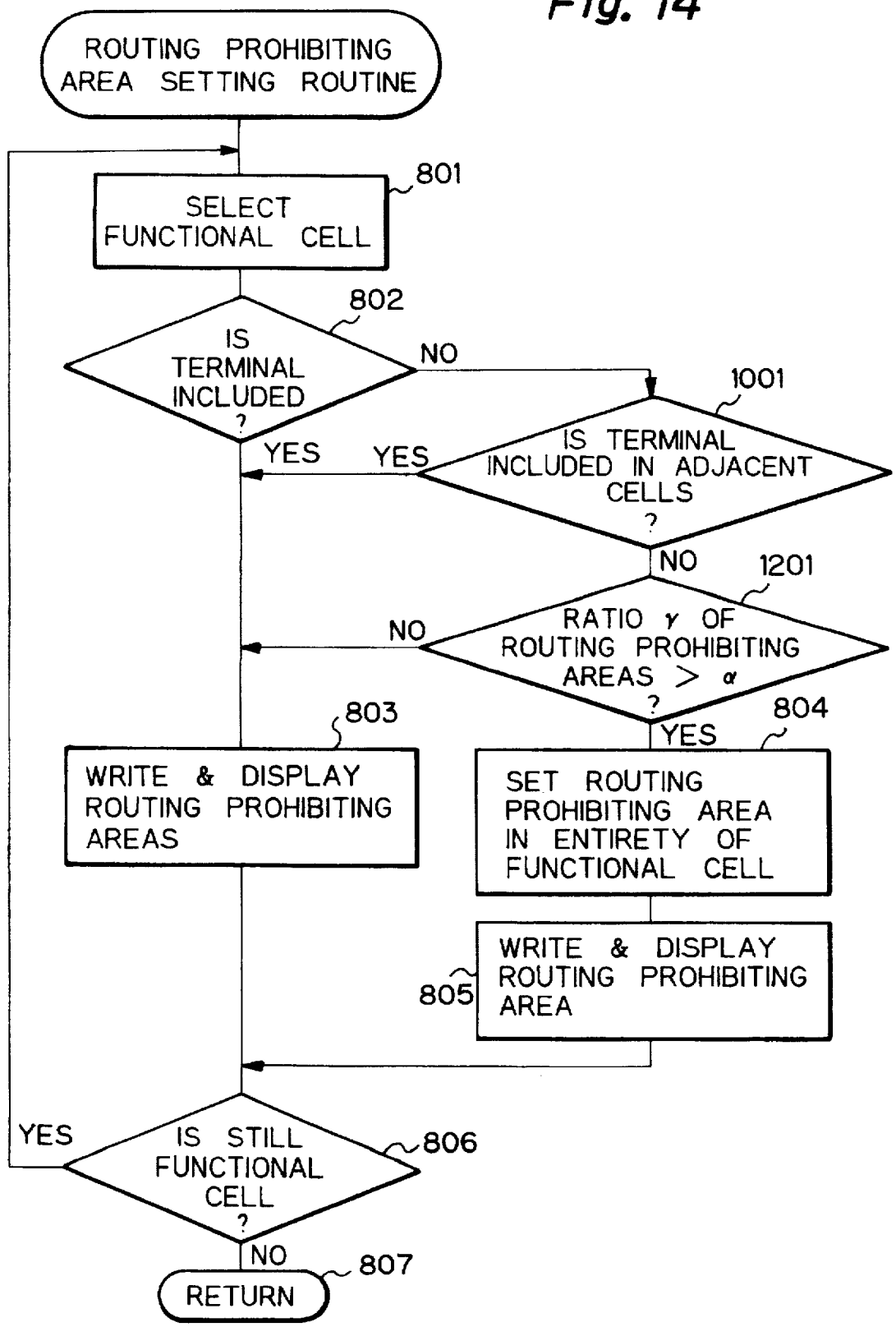
FIG. 14 is a fourth detailed flowchart of step 701 of FIG. 7.

In FIG. 14, which is a modification of the routine of FIG. 10, step 1201 is added to the routine of FIG. 10. In this case, note that FIGS. 15A through 15E correspond to FIGS. 11A through 11E, respectively. As a result, at step 1001, only when any functional cell adjacent to the selected functional cell such as 603 or 610 does not include the terminal T1 or T2, does the control proceed to step 1201. Otherwise, the control proceeds to step 1201.

At step 1201, if the selected functional cell is a functional cell 610 as shown in FIG. 6C, $\gamma < \alpha$, so the control proceeds to step 803. Contrary to this, if the selected functional cell is a functional cell 603 as shown in FIG. 6C, $\gamma > \alpha$, so the control proceeds to step 804.

Figures 15A, 15B:
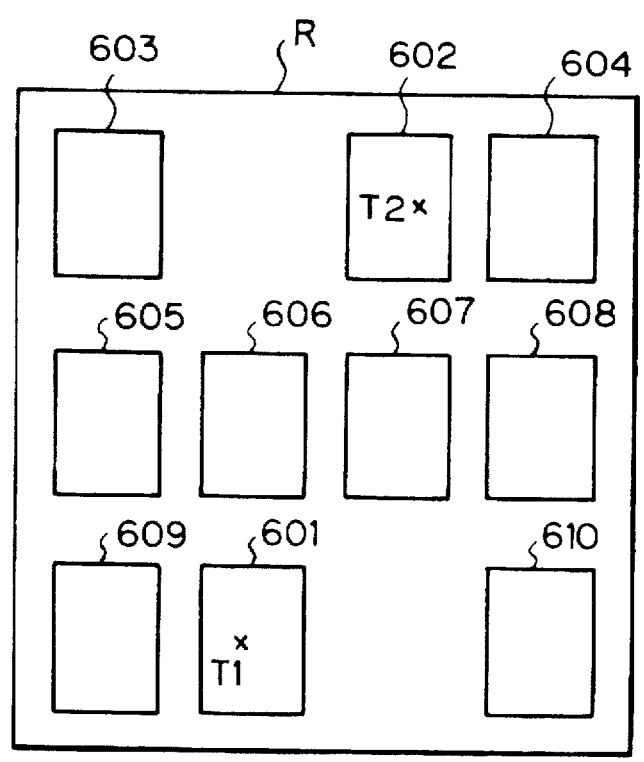
FIGS. 15A through 15E are diagrams for explaining the flowchart of FIG. 14.
Figure 15C:
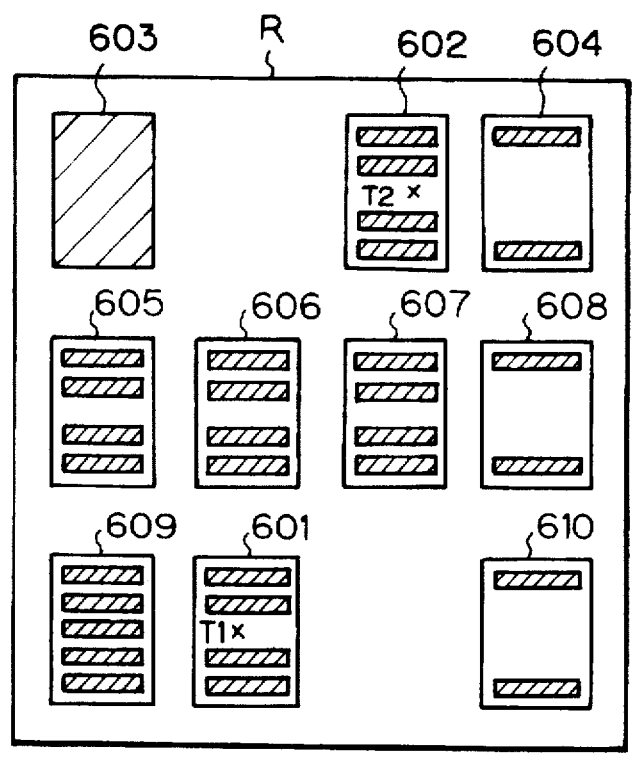

Therefore, at step 803, routing prohibiting information is read from the area A1 of the RAM 102, and routing prohibiting areas are set within the selected functional cell such as 601, 602, 604 through 610 in accordance with this information. The routing prohibiting areas are written into the area A5 of the RAM 102, and simultaneously, are displayed on the display unit 105 as shown in FIG. 15C.

On the other hand, at step 804, a routing prohibiting area is set on the entirety of the selected functional cell such as 603. Also, at step 805, the routing prohibiting area is written into the area A5 of the RAM 102, and simultaneously, is displayed on the display unit 105 as shown in FIG. 15C.

Figure 15D:
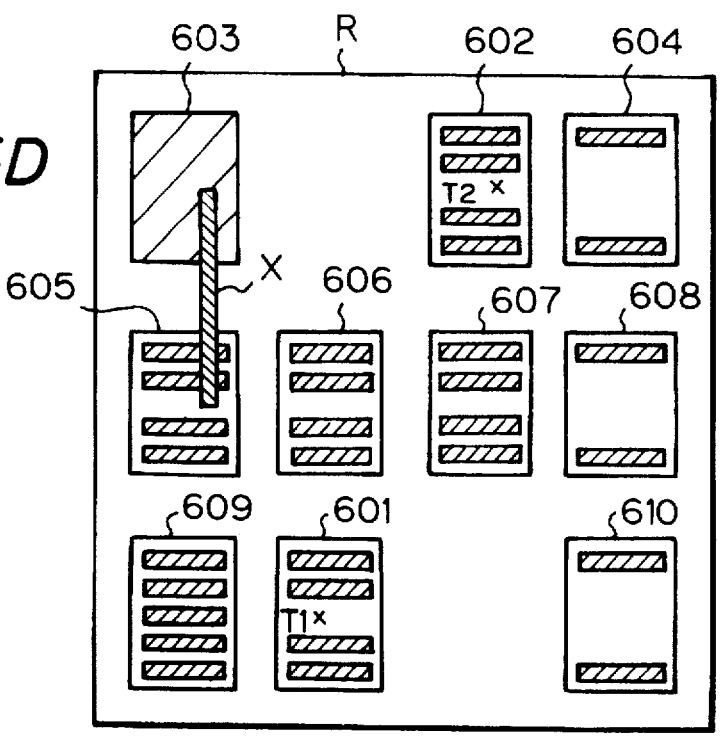
Figure 15E:
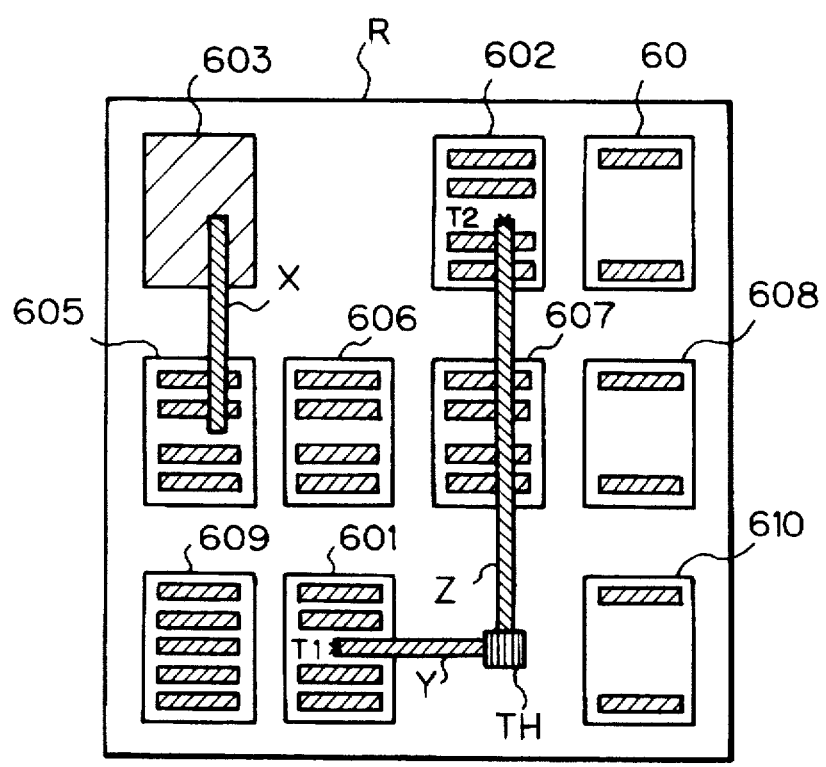

Then, as shown in FIGS. 15D and 15E, in the same way as in the prior art, the connections X, Y and Z are written into the area A5 of the RAM 102, and simultaneously, are displayed on the display unit 105.

According to FIGS. 7, 14 and 15A through 15E, the number of routing prohibiting areas including the connection X is 33, and is larger than that as shown in FIGS. 7, 8 and 9A through 9E. In this case, more effective use is made of the routing area R.

As explained hereinbefore, according to the present invention, since the number of routing prohibiting areas is reduced, the capacity of a memory needed for storing the routing prohibiting areas can be reduced. Also, since the setting and checking time for the routing prohibiting areas can be reduced, the operation of an automatic routing processing can be carried out at a higher speed.

I claim:

1. An automatic routing method for a semiconductor integrated circuit including a plurality of functional cells, comprising the steps of:

(a) receiving terminals to be electrically connected to each other;

(b) setting a routing area including said terminals;

(c1) determining whether or not a selected functional cell within said routing area includes one of said terminals;

(c2) determining whether or not a ratio of routing prohibiting areas to an entire area in said selected functional cell is larger than a predetermined value, when said selected functional cell does not include at least one of said terminals;

(d) setting routing prohibiting areas in said selected functional cell in accordance with routing prohibiting information, when the ratio of routing prohibiting areas to an entire area in said selected functional cell is not larger than said predetermined value and when said selected functional cell includes one of said terminals;

(e) setting a routing prohibiting area in the entirety of said selected functional cell, when said selected functional cell does not include any of said terminals;

(f) repeating said steps (c1), (c2), (d) and (e) for another selected functional cell within said routing area; and (g) routing a connection between said terminals to avoid said routing prohibiting areas.

2. The method as set forth in claim 1, further comprising a step of determining whether or not the ratio of routing prohibiting areas to the entire area in said selected functional cell is larger than the predetermined value, when adjacent functional cells to said selected functional cell do not include any of said terminals, said routing prohibiting area setting step (d) further setting routing prohibiting areas in said selected functional cell in accordance with said routing prohibiting information, when the ratio of routing prohibiting areas to an entire area in said selected functional cell is not larger than said predetermined value.

3. An automatic routing method for a semiconductor integrated circuit including a plurality of functional cells, comprising the steps of:

(a) receiving terminals to be electrically connected to each other;

(b) setting a routing area including said terminals;

(c) determining whether or not a selected functional cell within said routing area includes one of said terminals;

(d) determining whether or not adjacent functional cells to said selected functional cell include at least one of said terminals, when said selected functional cell does not include at least one of said terminals;

(e) setting routing prohibiting areas in said selected functional cell in accordance with routing prohibiting information, when said selected functional cell includes at least one of said terminals or when said adjacent functional cells to said selected functional cell include at least one of said terminals;

(f) setting a routing prohibiting area in the entirety of said selected functional cell, when said selected functional cell and said adjacent functional cells to said selected functional all do not include any of said terminals;

(g) repeating said steps (c), (d), (e) and (f) for another selected functional cell within said routing area; and (h) routing a connection between said terminals to avoid said routing prohibiting areas.

4. An automatic routing method for a semiconductor integrated circuit including a plurality of functional cells, comprising the steps of:

(a) receiving terminals to be electrically connected to each other;

(b) setting a routing area including said terminals;

(c) determining whether or not a selected functional cell within said routing area includes one of said terminals;

(d) determining whether or not a ratio of routing prohibiting areas to an entire area in said selected functional cell is larger than a predetermined value, when said selected functional cell does not include at least one of said terminals;

(e) setting routing prohibiting areas in said selected functional cell in accordance with routing prohibiting information, when said selected functional cell includes at least one of said terminals or when the ratio of said routing prohibiting areas to an entire area in said selected functional cell is not larger than said predetermined value;

(f) setting a routing prohibiting area in the entirety of said selected functional cell, when said selected functional cell does not include any of said terminals and when the ratio of said routing prohibiting areas to an entire area in said selected functional area is larger than said predetermined value;

(g) repeating said steps (c), (d), (e) and (f) for another selected functional cell within said routing area; and (h) routing a connection between said terminals to avoid said routing prohibiting areas.

5. An automatic routing method for a semiconductor integrated circuit including a plurality of functional cells, comprising the steps of:

(a) receiving terminals to be electrically connected to each other;

(b) setting a routing area including said terminals;

(c) determining whether or not a selected functional cell within said routing area includes one of said terminals;

(d) determining whether or not adjacent functional cells to said selected functional cell include at least one of said terminals, when said selected functional cell does not include at least one of said terminals;

(e) determining whether or not a ratio of routing prohibiting areas to an entire area in said selected functional cell is larger than a predetermined value, when said adjacent functional cells to said selected functional cell do not include any of said terminals;

(f) setting routing prohibiting areas in said selected functional cell in accordance with routing prohibiting information, when said selected functional cell includes at least one of said terminals, when the ratio of said routing prohibiting areas to an entire area in said selected functional cell is larger that said predetermined value and said adjacent functional cells to said selected functional all do not include any of said terminals, or when the ratio of said routing prohibiting areas in said selected functional is not larger than said predetermined value;

(g) setting a routing prohibiting area in the entirety of said selected functional cell, when said selected functional cell and said adjacent functional cells to said selected functional all do not include any of said terminals and when the ratio of said routing prohibiting areas to an entire area in said selected area is larger than said predetermined value;

(h) repeating said steps (c), (d), (e) and (f) for another selected functional cell within said routing area; and (i) routing a connection between said terminals to avoid said routing prohibiting areas.

* * * * *